(12) United States Patent
Hamasaki

(10) Patent No.: US 10,816,908 B2
(45) Date of Patent: Oct. 27, 2020

(54) LIGHT-EXPOSURE METHOD AND LIGHT-EXPOSURE APPARATUS

(71) Applicant: TOSHIBA MEMORY CORPORATION, Minato-ku (JP)

(72) Inventor: Masakazu Hamasaki, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/551,775

(22) Filed: Aug. 27, 2019

(65) Prior Publication Data

US 2020/0249581 A1 Aug. 6, 2020

(30) Foreign Application Priority Data

Feb. 5, 2019 (JP) .................... 2019-018450

(51) Int. Cl.
G03F 7/20 (2006.01)
(52) U.S. Cl.
CPC ...... *G03F 7/70633* (2013.01); *G03F 7/70066* (2013.01)
(58) Field of Classification Search
CPC .................... G03F 7/70066; G03F 7/70633
USPC .................... 355/53, 67, 68, 71, 77
See application file for complete search history.

(56) References Cited

U.S. PATENT DOCUMENTS

| 6,573,975 | B2 | 6/2003 | Govil et al. |
| 6,922,230 | B2 | 7/2005 | Govil et al. |
| 8,629,973 | B2 | 1/2014 | Zimmerman et al. |
| 2004/0015256 | A1* | 1/2004 | Conrad ............... G03F 7/70633 700/121 |
| 2005/0237505 | A1* | 10/2005 | Harned ............... G03F 7/70233 355/55 |
| 2010/0092881 | A1* | 4/2010 | Mos .................... G03F 7/70358 430/30 |

FOREIGN PATENT DOCUMENTS

| CN | 101487988 A | 7/2009 |
| JP | 2007-129102 A | 5/2007 |
| JP | 4047614 B2 | 2/2008 |
| JP | 2009-088142 A | 4/2009 |
| WO | WO-2019185230 A1 * | 10/2019 ............. G03F 7/705 |

\* cited by examiner

*Primary Examiner* — Colin W Kreutzer
(74) *Attorney, Agent, or Firm* — Oblon, McClelland, Maier & Neustadt, L.L.P.

(57) ABSTRACT

According to one embodiment, a correction plot in which a slit width is set different depending on overlay deviation in a shot region is generated. Then, a light-exposure scanning speed defined by a relative speed between a photomask stage with a photomask mounted thereon and a stage with a processing object mounted thereon is set, to obtain a desired light-exposure amount at each coordinate position, in accordance with the slit width in the correction plot. Then, a light-exposure process is performed, while controlling the slit width of a light-exposure slit, the photomask stage, and the stage, in accordance with the correction plot and the light-exposure scanning speed.

16 Claims, 7 Drawing Sheets

| DEVIATION INDEX (ABSOLUTE VALUE) | SLIT WIDTH |
|---|---|
| A OR LESS | B |
| A OR MORE | C1, C2, C3, ··· (C1>C2>C3>···) |

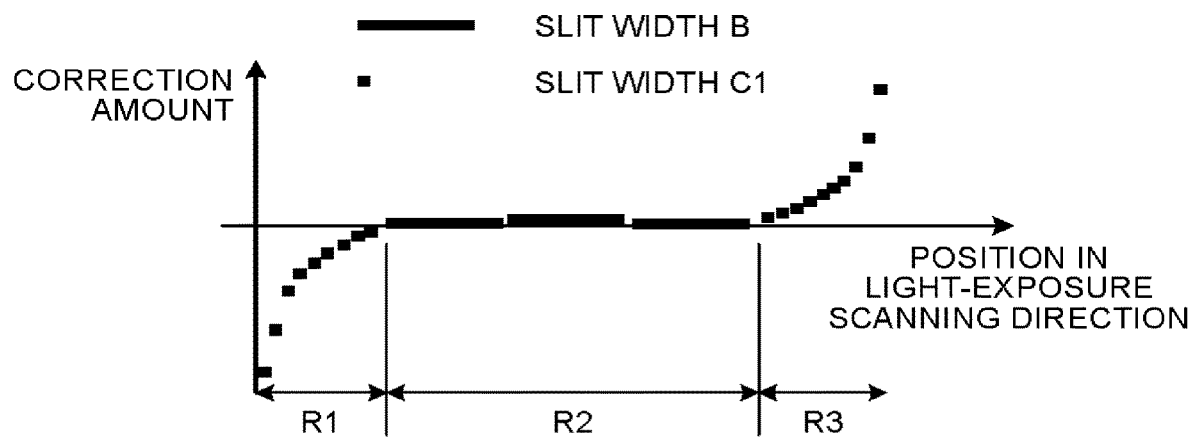

LIGHT-EXPOSURE METHOD AND LIGHT-EXPOSURE APPARATUS

CROSS-REFERENCE TO RELATED APPLICATIONS

This application is based upon and claims the benefit of priority from Japanese Patent Application No. 2019-018450, filed on Feb. 5, 2019; the entire contents of which are incorporated herein by reference.

FIELD

An embodiment described herein relates generally to a light-exposure method and a light-exposure apparatus.

BACKGROUND

In a light-exposure process, illumination light is caused to pass through a light-exposure slit, and is incident onto a light-exposure mask that defines a light-exposure pattern. The light-exposure mask and a photosensitive substrate are operated in synchronism with each other for light-exposure scanning, to perform patterning onto the photosensitive substrate.

BRIEF DESCRIPTION OF THE DRAWINGS

FIG. 6 is a diagram illustrating an example of a correction plot;

FIG. 7 is a diagram illustrating the relationship between the slit width, deviation following property, and light-exposure scanning speed;

DETAILED DESCRIPTION

In general, according to one embodiment, a correction plot in which a slit width is set different depending on overlay deviation in a shot region is generated. Then, a light-exposure scanning speed defined by a relative speed between a photomask stage with a photomask mounted thereon and a stage with a processing object mounted thereon is set, to obtain a desired light-exposure amount at each coordinate position, in accordance with the slit width in the correction plot. Then, a light-exposure process is performed, while controlling the slit width of a light-exposure slit, the photomask stage, and the stage, in accordance with the correction plot and the light-exposure scanning speed.

An exemplary embodiment of a light-exposure method and a light-exposure apparatus will be explained below in detail with reference to the accompanying drawings. The present invention is not limited to the following embodiment.

However, according to the conventional technique, the width of the light-exposure slit (which will be referred to as "slit width", hereinafter) is steady during a light-exposure process to one shot region. Accordingly, when there is light-exposure overlay deviation, one of the following operations is performed: Regardless of a decrease in light-exposure scanning speed, the slit width is set smaller before shift to one shot region to finely correct the light-exposure overlay deviation. Alternatively, in order to put much weight in the light-exposure scanning speed, the accuracy about the light-exposure overlay deviation is set lower.

Figure 1:
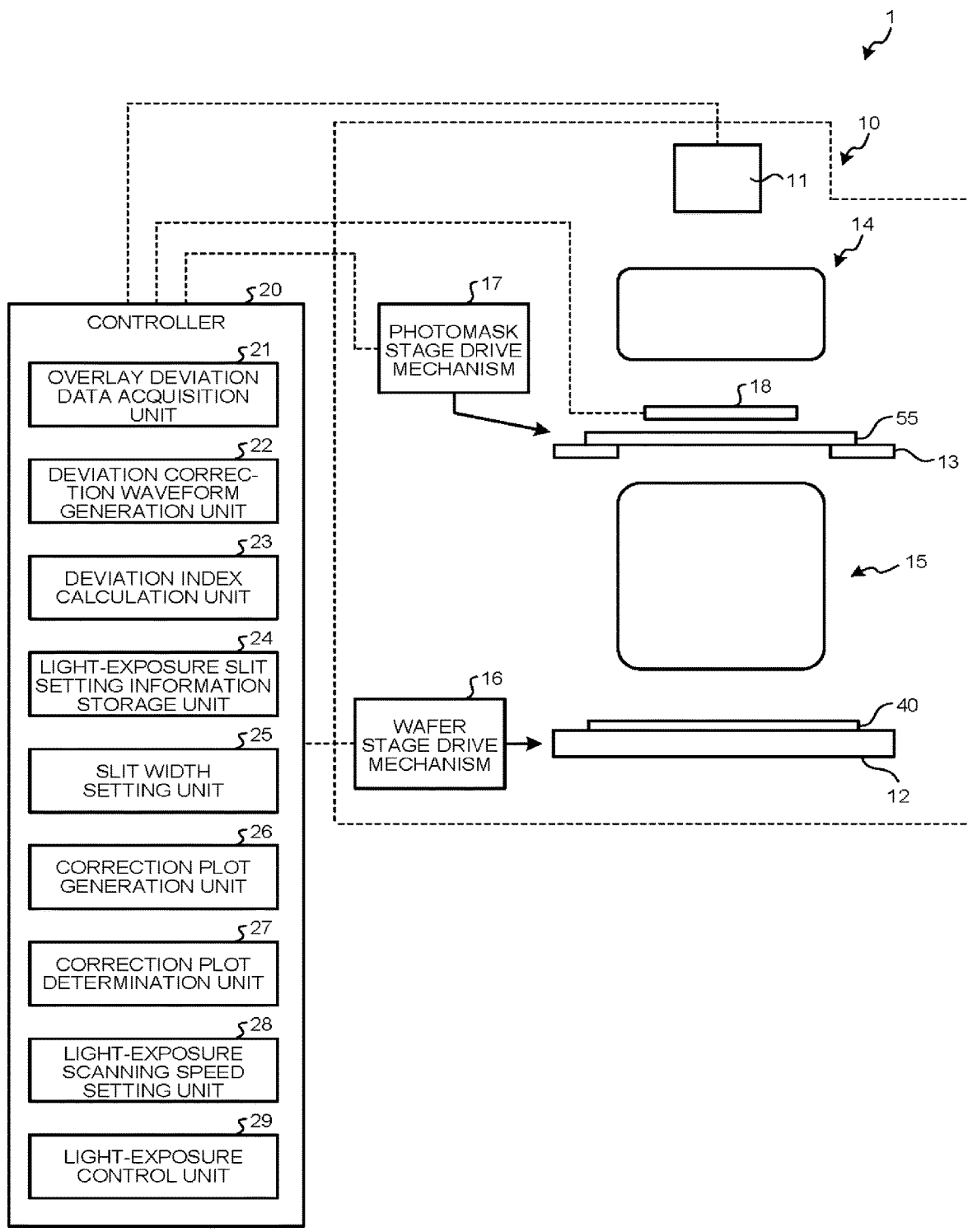
FIG. 1 is a diagram illustrating a schematic configuration of a light-exposure apparatus according to an embodiment.

FIG. 1 is a diagram illustrating a schematic configuration of a light-exposure apparatus according to an embodiment. The light-exposure apparatus 1 includes a light-exposure processing section 10 and a controller 20. The light-exposure processing section 10 includes a light source 11, a wafer stage 12, and a photomask stage 13. As the light source 11, for example, a laser light source that outputs ArF excimer laser light or the like is used. The wafer stage 12 is configured to mount thereon a semiconductor substrate (wafer) 40 as a processing object. The photomask stage 13 is provided between the light source 11 and the wafer stage 12, and is configured to mount thereon a photomask 55.

Further, the light-exposure processing section 10 includes an illumination optical system 14 and a projection optical system 15. The illumination optical system 14 is configured to radiate light from the light source 11 onto the photomask 55. The projection optical system 15 is configured to project light passing through the photomask 55, onto the semiconductor substrate 40.

Further, the light-exposure processing section 10 includes a wafer stage drive mechanism 16, a photomask stage drive mechanism 17, and a light-exposure slit 18. The wafer stage drive mechanism 16 is configured to move the wafer stage 12 in a direction parallel with the mounting plane for the semiconductor substrate 40. The photomask stage drive mechanism 17 is configured to move the photomask stage 13 in a direction parallel with the mounting plane for the photomask 55.

Figure 2:
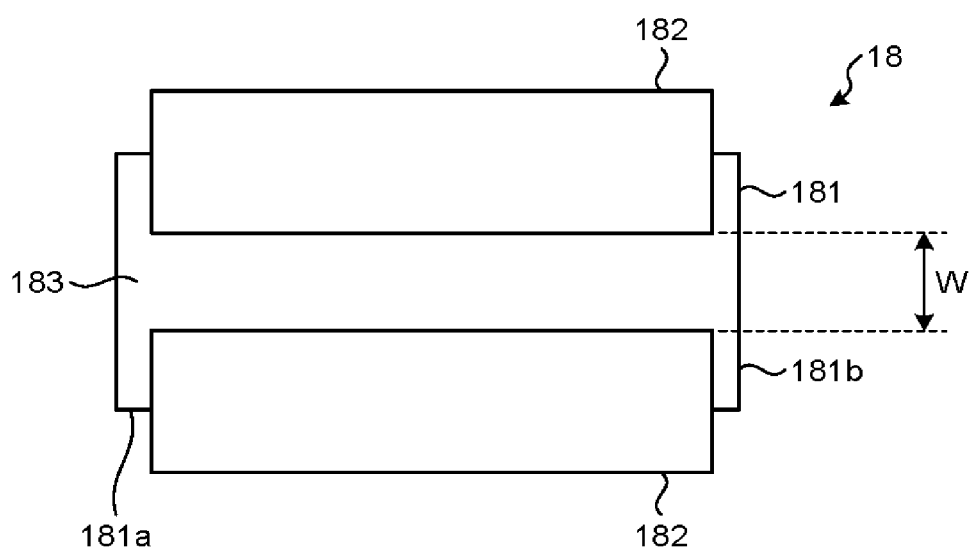
FIG. 2 is a top view illustrating a configuration example of a light-exposure slit according to the embodiment.

The light-exposure slit 18 is provided at one side of the photomask stage 13 closer to the light source 11, to define a scope of light to be incident onto the semiconductor substrate 40 (light-exposure region). FIG. 2 is a top view illustrating a configuration example of the light-exposure slit according to the embodiment. The light-exposure slit 18 includes a slit main body 181 formed of a rectangular tubular body, and two light shielding parts 182 each having a rectangular shape. The light shielding parts 182 are arranged along the long sides 181a of an opening 183 of the slit main body 181, and are configured to be moved by a drive mechanism (not illustrated) in the extending direction of the short sides 181b. Consequently, the slit width W, which is the distance between the two light shielding parts 182 arranged side by side in the direction of the short sides 181b, can be changed. Here, the light incident direction is a direction perpendicular to the paper face of FIG. 2.

The controller 20 is configured to control the light-exposure processing section 10. The controller 20 includes an overlay deviation data acquisition unit 21, a deviation correction waveform generation unit 22, a deviation index calculation unit 23, a light-exposure slit setting information storage unit 24, a slit width setting unit 25, a correction plot generation unit 26, a correction plot determination unit 27, a light-exposure scanning speed setting unit 28, and a light-exposure control unit 29.

Figure 3:
FIG. 3 is a diagram illustrating an example of overlay deviation data.

The overlay deviation data acquisition unit 21 is configured to acquire overlay deviation data on each of the shot regions of the semiconductor substrate 40 to be treated as a light-exposure object. The overlay deviation data may be actual measurement data that is an overlay deviation result between upper and lower layers of a semiconductor substrate 40 obtained by performing a light-exposure process in the past, or may be a simulation result obtained by a simulation additionally considering some of the illumination conditions, the patterns to be formed on a semiconductor substrate 40, the aberration of the light-exposure processing section 10, and so forth. FIG. 3 is a diagram illustrating an example of the overlay deviation data. In FIG. 3, the horizontal axis indicates the position in the light-exposure scanning direction in a shot region of a light-exposure object, and the vertical axis indicates the overlay deviation amount. In this example, the overlay deviation is larger at positions closer to the opposite ends of the shot region in the light-exposure scanning direction, while the overlay deviation amount is almost zero at about the center.

Figures 4, 5:
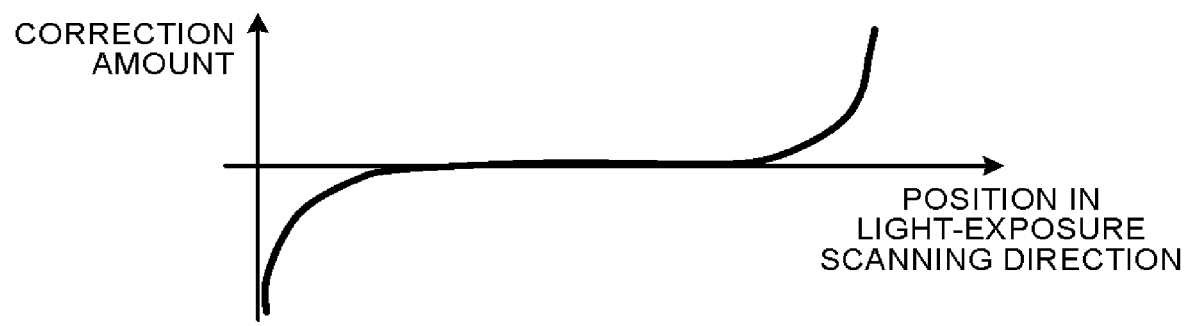
FIG. 4 is a diagram illustrating an example of deviation correction waveform.
FIG. 5 is a diagram illustrating an example of slit width setting information.

The deviation correction waveform generation unit 22 is configured to generate a deviation correction waveform necessary for correcting the overlay deviation by the light-exposure process, on the basis of the overlay deviation data. The deviation correction waveform is obtained by inverting the sign of an overlay deviation amount of the overlay deviation data at each coordinate position. FIG. 4 is a diagram illustrating an example of the deviation correction waveform. In FIG. 4, the horizontal axis indicates the position in the light-exposure scanning direction in the shot region of the light-exposure object, and the vertical axis indicates the correction amount. FIG. 4 is formed by inverting FIG. 3 with respect to the horizontal axis.

The deviation index calculation unit 23 is configured to calculate a deviation index that indicates an overlay deviation degree at each coordinate position, from the deviation correction waveform. The deviation index is exemplified by a correction amount at each coordinate position, or the inclination of the deviation correction waveform at each coordinate position. The inclination of the deviation correction waveform is calculated by differentiating the deviation correction waveform.

The light-exposure slit setting information storage unit 24 stores light-exposure slit setting information, which is used for setting the slit width and the light-exposure scanning speed to attain a predetermined light-exposure amount, in order to perform light-exposure while changing the slit width. The light-exposure slit setting information contains slit width setting information that correlates the deviation index with the slit width by values to enable the correction to be performed with predetermined accuracy or more.

For example, the slit width setting information correlates ranges of the deviation index with values of the slit width. Further, a range of the deviation index is correlated with a plurality of values of the slit width. The plurality of values of the slit width thus provided can be selected by the slit width setting unit 25 in descending order of value from the largest one. FIG. 5 is a diagram illustrating an example of the slit width setting information. This example illustrates a case where light-exposure is performed by using two values of the slit width during the light-exposure process. When the deviation index is A or less in absolute value, the slit width is set to B. When the deviation index is A or more in absolute value, the slit width is set to C1, C2, C3, . . . (C1>C2>C3> . . . ). Here, when the deviation index is A in absolute value, the slit width is set preferentially to B (wider slit) to ensure the light-exposure scanning speed.

Further, the slit width is set within a range in which the light-exposure slit 18 is operable as a device. Further, the slit width is set within a range which does not affect the averaging effect (assurance standards). For example, even if a lens in the projection optical system 15 has a minute stepped portion on the surface, when the slit width is large, light radiation through this stepped portion is averaged within the entire light radiation area, and thus is less affected by the stepped portion. However, when the slit width is small, light radiation through this stepped portion is less averaged, and thus is more affected by the stepped portion. For this reason, the slit width is set within a range which can average the influence of such a stepped portion, even if any.

The light-exposure slit setting information contains light-exposure scanning speed setting information that prescribes the light-exposure scanning speed by values to attain a predetermined light-exposure amount, with respect to the slit width. When light-exposure is being performed to a shot region, the light irradiation amount to every position needs to be a predetermined amount. Accordingly, a value of the light-exposure scanning speed to irradiate every position with a predetermined amount of light is determined in advance for each value of the slit width. The light-exposure scanning speed setting information prescribes this matter.

In order to generate a correction plot, the slit width setting unit 25 acquires the slit width setting information form the light-exposure slit setting information storage unit 24, and sets slit width conditions. For example, in the slit width setting information of FIG. 5, when the deviation index is A or less in absolute value, the slit width is steady at B. However, when the deviation index is A or more in absolute value, the slit width has a plurality of values C1, C2, C3, . . . . Accordingly, when generating the initial correction plot, the slit width setting unit 25 sets slit width conditions such that, when the deviation index is A or less in absolute value, the slit width is B, and when the deviation index is A or more in absolute value, the slit width is C1 that is the largest one.

Further, when the correction plot determination unit 27 determines that the difference between a correction plot and a deviation correction waveform does not fall within an acceptable range, the slit width setting unit 25 resets the slit width conditions by selecting a value of the slit width the largest next to the currently set value, as a value of the slit width for the deviation index being A or more in absolute value. For example, when the slit width is currently set to C1 for the deviation index being A or more in absolute value, the slit width is newly set to C2.

The correction plot generation unit 26 is configured to generate a correction plot by setting a value of the slit width correlated with a value of the deviation index at each coordinate position, with reference to the slit width conditions thus set. FIG. 6 is a diagram illustrating an example of the correction plot. In FIG. 6, the horizontal axis indicates the position in the light-exposure scanning direction, and the vertical axis indicates the correction amount. Further, FIG. 6 illustrates a state where the light-exposure slit 18 is overlaid on the deviation correction waveform of FIG. 4. As illustrated in FIG. 6, the correction plot is generated such that the region R2 having a smaller correction amount is set with a larger value B of the slit width, and the regions R1 and R3 having a larger correction amount are set with a smaller value C1 of the slit width.

The correction plot determination unit 27 is configured to determine whether the difference between a deviation correction waveform and a correction plot falls within an acceptable range. For example, the acceptable range is formed of a range in which the overlay deviation amount becomes permissible under desired accuracy or more when the light-exposure process is performed while the light-exposure slit 18 is set different depending on the conditions corresponding to the correction plot. For example, a determination coefficient, which is the square of a correlation coefficient R, may be used to determine whether the difference between a deviation correction waveform and a correction plot falls within the acceptable range. Here, the acceptable range may be a range set by the specifications. When the difference does not fall within the acceptable range, the correction plot determination unit 27 reports this fact to the slit width setting unit 25.

When the difference between a deviation correction waveform and a correction plot falls within the acceptable range, the light-exposure scanning speed setting unit 28 sets the light-exposure scanning speed to obtain a desired light-exposure amount for every value of the slit width set at each coordinate position. The light-exposure scanning speed setting unit 28 can acquire a value of the light-exposure scanning speed corresponding to a value of the slit width, with reference to the light-exposure scanning speed setting information in the light-exposure slit setting information storage unit 24. However, a value of the light-exposure scanning speed may be obtained by calculation. For example, the light-exposure scanning speed is calculated by the following formula (1).

Light-exposure scanning speed=Reference light-exposure scanning speed×Set slit width/Reference slit width    (1)

FIG. 7 is a diagram illustrating the relationship between the slit width, deviation following property, and light-exposure scanning speed. A correction for overlay deviation is performed in units of the width of the light-exposure slit 18. Accordingly, when the slit width is larger, the light-exposure scanning speed can be set higher, although the deviation following property becomes lower at a position, such as the regions R1 and R3 of FIG. 6, for example. On the other hand, when the slit width is smaller, the light-exposure scanning speed becomes lower, although the deviation following property becomes higher at a position, such as the regions R1 and R3 of FIG. 6, for example.

Conventionally, the width of the light-exposure slit 18 is steady for one shot region. For example, when overlay deviation is not generated so much over the entirety of the shot region in the light-exposure scanning direction, the light-exposure scanning speed can be increased by using a larger width of the light-exposure slit 18. Further, when overlay deviation is generated, the deviation following property can be enhanced by using a smaller width of the light-exposure slit 18. However, in this case, the light-exposure scanning speed becomes lower, as compared with a case using a larger width of the light-exposure slit 18.

On the other hand, in this embodiment, as illustrated in FIG. 6, the slit width is set different depending on the degree of the deviation index, inside one shot region. Consequently, in a region where the deviation falls within the acceptable range, the light-exposure scanning speed can be higher by performing light-exposure with a larger width of the light-exposure slit 18. Further, in a region where the deviation exceeds the acceptable range, the deviation following property can be enhanced by performing light-exposure with a smaller width of the light-exposure slit 18. Here, as light-exposure is performed with a smaller width of the light-exposure slit 18 only for a region where the deviation exceeds the acceptable range, the time necessary for the light-exposure process can be shortened, as compared with a case where light-exposure is performed with a smaller width of the light-exposure slit 18 over the entire shot region.

The light-exposure control unit 29 is configured to control the light-exposure processing section 10 by using a generated correction plot and a set value of the light-exposure scanning speed. For example, the light-exposure control unit 29 controls the light source 11, the wafer stage drive mechanism 16, the photomask stage drive mechanism 17, and the light-exposure slit 18.

Figure 8:
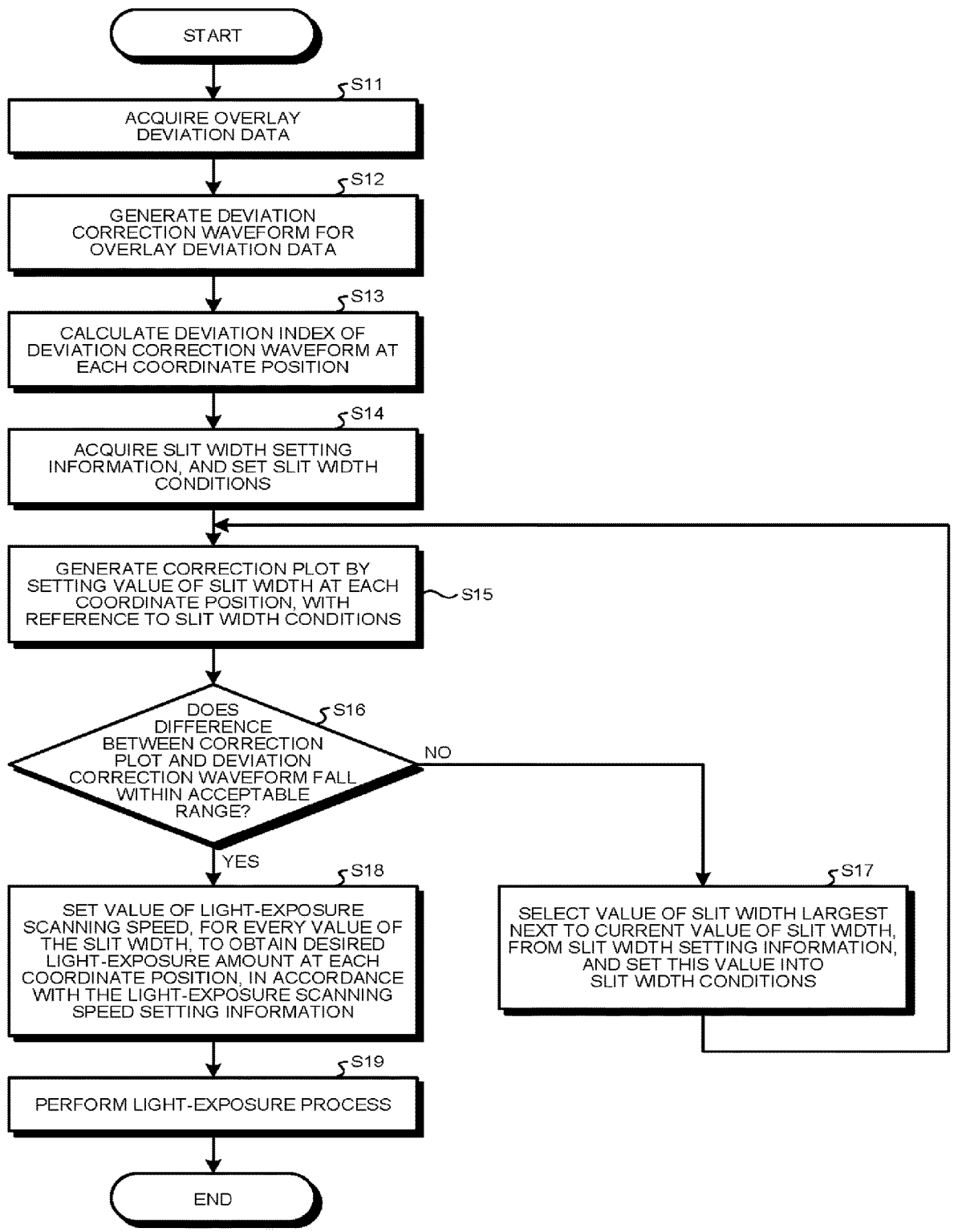
FIG. 8 is a flowchart illustrating an example of the sequence of a light-exposure method according to the embodiment.

Next, an explanation will be given of a light-exposure method in the light-exposure apparatus configured as described above. FIG. 8 is a flowchart illustrating an example of the sequence of a light-exposure method according to the embodiment. First, the overlay deviation data acquisition unit 21 of the controller 20 acquires overlay deviation data on a shot region to be subjected to light-exposure (step S11). For example, the overlay deviation data acquisition unit 21 acquires the overlay deviation data illustrated in FIG. 3. The overlay deviation data may be data actually measured, or may be a result obtained by a simulation.

Then, the deviation correction waveform generation unit 22 generates a deviation correction waveform for the overlay deviation data (step S12). The deviation correction waveform may be obtained by inverting the sign of a value of the overlay deviation data at each coordinate position. For example, the deviation correction waveform generation unit 22 generates the deviation correction waveform illustrated in FIG. 4.

Thereafter, deviation index calculation unit 23 calculates a deviation index of the deviation correction waveform at each coordinate position (step S13). The deviation index may be the absolute value of the deviation correction waveform at each coordinate position, or may be the absolute value of the inclination of the deviation correction waveform at each coordinate position.

Then, the slit width setting unit 25 acquires the slit width setting information from the light-exposure slit setting information storage unit 24, and sets slit width conditions (step S14). For example, the slit width setting unit 25 sets slit width conditions, as illustrated in FIG. 5, such that, when the deviation index is A or less in absolute value, the slit width is B, and, when the deviation index is A or more in absolute value, the slit width is C1.

Thereafter, the correction plot generation unit 26 generates a correction plot by setting a value of the slit width corresponding to a calculated value of the deviation index at each coordinate position, with reference to the slit width conditions (step S15). For example, as illustrated in FIG. 6, the correction plot generation unit 26 sets the slit width B for the region R2 and sets the slit width C1 for the regions R1 and R3, in accordance with the deviation index obtained from the deviation correction waveform.

Thereafter, the correction plot determination unit 27 determines whether the difference between the correction plot generated in step S15 and the deviation correction waveform generated in step S12 falls within an acceptable range (step S16). For example, the correction plot determination unit 27 determines whether the difference between these generated results falls within a range to achieve desired accuracy or more. For example, this determination is performed by using a determination coefficient.

When the difference between the correction plot and the deviation correction waveform does not fall within the acceptable range (No in step S16), the slit width setting unit 25 selects a value of the slit width the largest next to the current value of the slit width, from the slit width setting information, and sets this value into the slit width conditions (step S17). Thereafter, the sequence returns to step S15. Then, the processes of steps S15 to S17 are repeatedly performed until the difference between the correction plot and the deviation correction waveform comes to fall within the acceptable range. For example, although the regions R1 and R3 are set with the slit width C1 in FIG. 6, the correction plot is generated such that the slit width becomes gradually smaller, as C2, C3, and so forth.

On the other hand, when the difference between the correction plot and the deviation correction waveform falls within the acceptable range (Yes at step S16), the light-exposure scanning speed setting unit 28 sets a value of the light-exposure scanning speed, for every value of the slit width, to obtain a desired light-exposure amount at each coordinate position, in accordance with the light-exposure scanning speed setting information (step S18). Specifically, the light-exposure scanning speed is set higher at a coordinate position where the slit width is smaller, as compared with a coordinate position where the slit width is larger.

Then, the light-exposure control unit 29 controls the light-exposure slit 18, the wafer stage drive mechanism 16, and the photomask stage drive mechanism 17, in accordance with the correction plot and the light-exposure scanning speed, to perform the light-exposure process (step S19). As a result, the sequence ends.

Figure 9A:
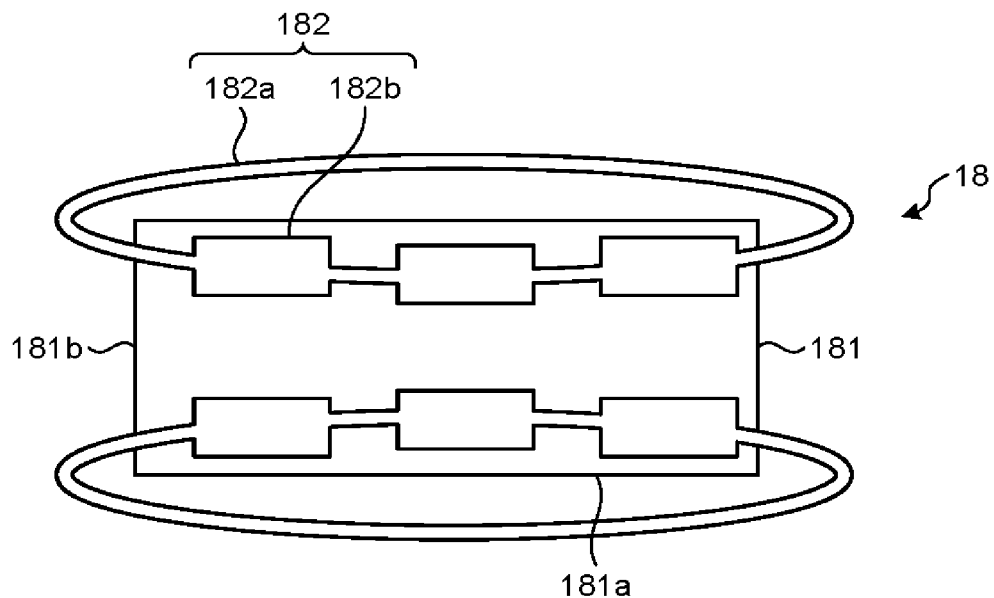
FIGS. 9A and 9B are diagrams illustrating other configuration examples of the light-exposure slit.
Figure 9B:
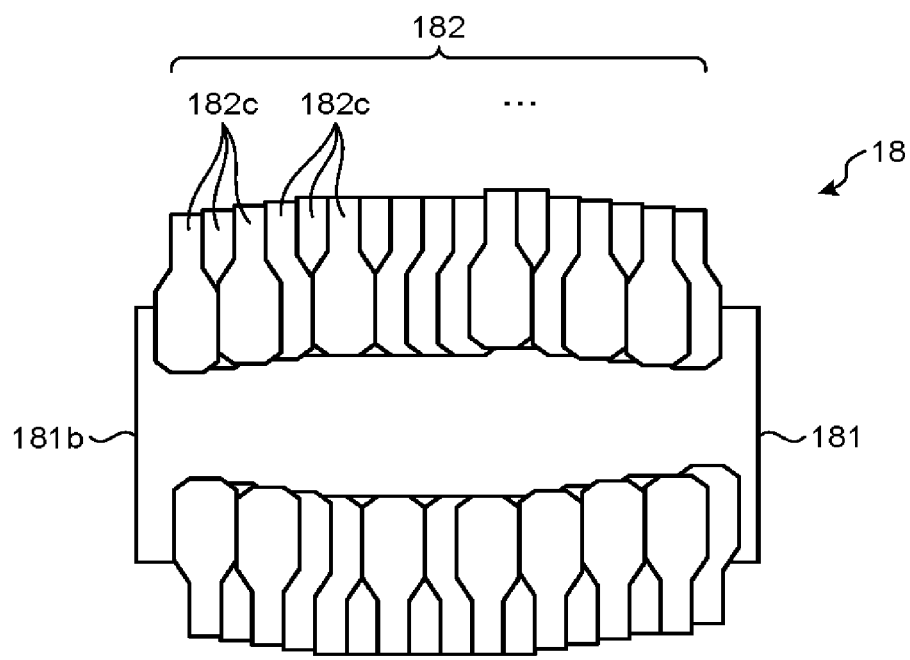

In FIG. 2, each of the light shielding parts 182 of the light-exposure slit 18 has a rectangular shape. However, the embodiment is not limited to this example. FIGS. 9A and 9B are diagrams illustrating other configuration examples of the light-exposure slit. In FIG. 9A, each of the light shielding parts 182 is formed of a chain 182a and plate-like members 182b provided on the chain 182a. The chain 182a is configured to rotate in the extending direction of the long sides 181a of the slit main body 181. For example, when the larger value B of the slit width is to be selected in the example described above, the chain 182a is rotated to place the part provided with no plate-like members 182b at the position inside the slit main body 181. Further, when the smaller value C1 of the slit width is to be selected, as illustrated in FIG. 9A, the chain 182a is rotated to place the part provided with the plate-like members 182b at the position inside the slit main body 181.

As illustrated in FIG. 9B, each of the light shielding parts 182 may be formed of a plurality of strip-like members 182c extending in the direction of the short sides 181b of the slit main body 181. Each of the strip-like members 182c is configured to be moved by a drive mechanism (not illustrated) in the extending direction of the short sides 181b of the slit main body 181. With this arrangement, the light-exposure amount can be adjusted finely in accordance with the respective positions in the direction of the long sides 181a of the slit main body 181.

Figure 10:
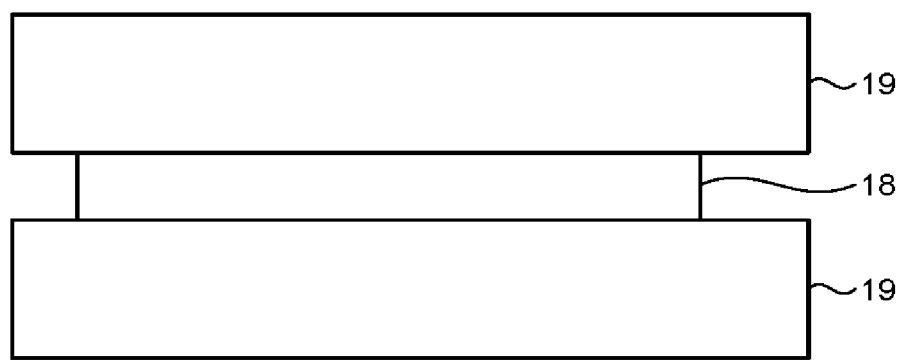
FIG. 10 is a diagram illustrating an example of a light shielding method in the light-exposure apparatus.

As described above with reference to FIGS. 2, 9A, and 9B, the light-exposure slit 18 is provided with the light shielding parts 182. However, the light-exposure amount may be adjusted by using another method. FIG. 10 is a diagram illustrating an example of a light shielding method in the light-exposure apparatus. In general, the light-exposure processing section 10 is provided with a masking blade 19 on the photomask stage 13 side of the light-exposure slit 18. Masking blades 19 of this type may be used to adjust the region for irradiating the semiconductor substrate 40.

Here, in the example described above, as illustrated in FIG. 5, a correction plot is generated by using two types of the slit width. However, a correction plot may be generated by using three or more types of the slit width. In this case, the slit width setting information comes to prescribe ranges of the deviation index in absolute value with respect to a plurality of types of the slit width.

Figure 11:
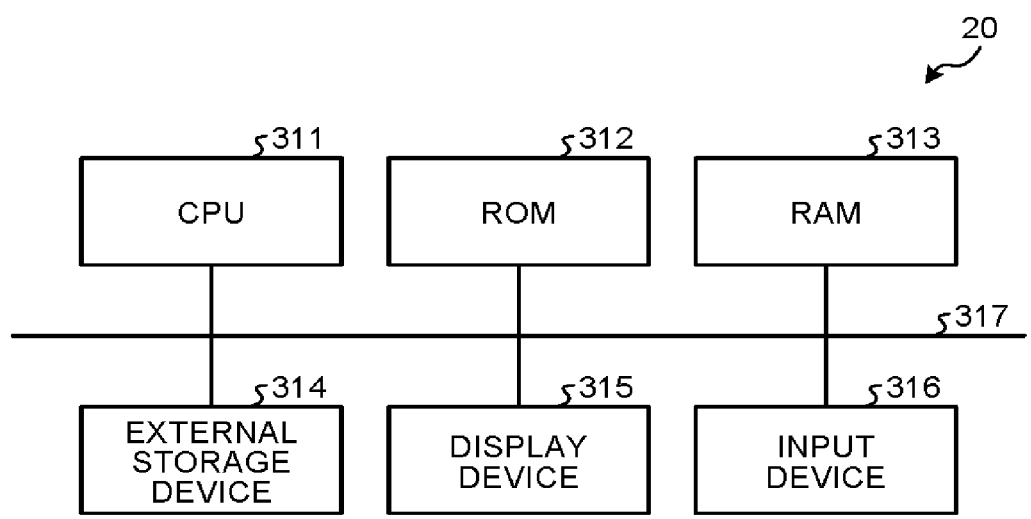
FIG. 11 is a diagram illustrating a hardware configuration example of a controller.

FIG. 11 is diagram illustrating a hardware configuration example of the controller. The controller 20 has a hardware configuration utilizing an ordinary computer, in which a Central Processing Unit (CPU) 311, a Read Only Memory (ROM) 312, a Random Access Memory (RAM) 313 serving as the main storage device, an external storage device 314, such as a Hard Disk Drive (HDD), Solid State Drive (SSD), or Compact Disc (CD) drive device, a display device 315, such as a liquid crystal display device, and an input device 316, such as a keyboard and/or a mouse, are included, and are connected to each other via a bus line 317.

A program to be executed by the controller 20 according to this embodiment has been prepared to perform the method illustrated in FIG. 8. This program is provided in a state recorded in a computer readable recording medium, such as a CD-ROM, flexible disk (FD), CD-R, or Digital Versatile Disk (DVD), by a file in an installable format or executable format.

Alternatively, a program to be executed by the controller 20 according to this embodiment may be provided such that the program is stored in a computer connected to a network, such as the internet, and is downloaded via the network. Alternatively, a program to be executed by the controller 20 according to this embodiment may be provided such that the program is provided or distributed via a network, such as the internet.

Alternatively, a program according to this embodiment may be provided in a state incorporated in an ROM or the like in advance.

According to the embodiment, a deviation index is calculated at each coordinate position, from a deviation correction waveform for correcting overlay deviation data on a shot region, and a correction plot is generated in which the slit width is set different depending on the deviation index. Then, the light-exposure scanning speed in the light-exposure process is set in accordance with the slit width at each coordinate position in the correction plot. Consequently, when light-exposure is performed to a shot region including overlay deviation, a position larger in overlay deviation amount is set with a smaller value of the slit width to enhance the deviation following property, and a position smaller in overlay deviation amount is set with a larger value of the slit width to increase the light-exposure scanning speed. As a result, in the light-exposure process, it is possible to correct the overlay deviation to achieve desired overlay accuracy, while suppressing a decrease in light-exposure scanning speed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light-exposure method comprising:
generating a correction plot in which a slit width is set different depending on overlay deviation in a shot region;
setting a light-exposure scanning speed defined by a relative speed between a photomask stage with a photomask mounted thereon and a stage with a processing object mounted thereon, to obtain a desired light-exposure amount at each coordinate position, in accordance with the slit width in the correction plot; and
performing a light-exposure process, while controlling the slit width of a light-exposure slit, the photomask stage, and the stage, in accordance with the correction plot and the light-exposure scanning speed.

2. The light-exposure method according to claim 1, wherein the generating the correction plot includes
acquiring overlay deviation data,
generating a deviation correction waveform corresponding to the overlay deviation data,
calculating a deviation index of the deviation correction waveform at each coordinate position,
setting a slit width condition by acquiring slit width setting information that prescribes a relation between the deviation index and the slit width, and
generating the correction plot that sets a value of the slit width corresponding to a value of the deviation index at each coordinate position, with reference to the slit width condition.

3. The light-exposure method according to claim 2, wherein
the generating the correction plot further includes determining whether a difference between the correction plot and the deviation correction waveform falls within an acceptable range, and
in the setting the light-exposure scanning speed, the light-exposure scanning speed is set when the difference falls within the acceptable range.

4. The light-exposure method according to claim 3, wherein
the slit width setting information correlates a plurality of values of the slit width with values of the deviation index such that a value of the slit width is larger as a value of the deviation index in absolute value is smaller, and
the generating the correction plot further includes
resetting the slit width condition by selecting a value of the slit width largest next to a currently set value of the slit width from the slit width setting information when the difference does not fall within the acceptable range, and
generating the correction plot, thereafter.

5. The light-exposure method according to claim 2, wherein, in the slit width setting information, a value of the slit width is set for each of a plurality of ranges obtained by dividing a range of the deviation index.

6. The light-exposure method according to claim 2, wherein the slit width is within a range settable by a device.

7. The light-exposure method according to claim 2, wherein the overlay deviation data is data obtained by actually measuring a light-exposure positional deviation or data obtained by a simulation.

8. The light-exposure method according to claim 2, wherein the deviation index is expressed by an overlay deviation amount of the deviation correction waveform at each coordinate position, or an inclination of the deviation correction waveform at each coordinate position.

9. A light-exposure apparatus comprising:
a light-exposure processing section that includes a light source, a photomask stage configured to mount a photomask thereon and movable in a direction parallel with a mounting plane for the photomask, a illumination optical system configured to radiate light from the light source onto the photomask, a stage configured to mount a processing object thereon and movable in a direction parallel with a mounting plane for the processing object, a projection optical system configured to project light passing through the photomask onto the processing object on the stage, and a light-exposure slit configured to change a slit width to adjust an light irradiation amount from the illumination optical system; and
a controller configured to control the light-exposure processing section, wherein,
when performing a light-exposure process to a shot region of the processing object, the controller is configured to change a slit width of the light-exposure slit and a light-exposure scanning speed defined by a relative speed between the photomask stage and the stage, in accordance with an overlay deviation amount of the processing object.

10. The light-exposure apparatus according to claim 9, wherein the controller is configured to:
generate a correction plot in which the slit width is set different depending on overlay deviation in the shot region,
set the light-exposure scanning speed defined by a relative speed between the photomask stage and the stage, to obtain a desired light-exposure amount at each coordinate position, in accordance with the slit width in the correction plot, and
perform the light-exposure process, while controlling the slit width of the light-exposure slit, the photomask stage, and the stage, in accordance with the correction plot and the light-exposure scanning speed.

11. The light-exposure apparatus according to claim 10, wherein, in the generation of the correction plot, the controller is configured to:
acquire overlay deviation data,
generate a deviation correction waveform corresponding to the overlay deviation data,
calculate a deviation index of the deviation correction waveform at each coordinate position,
set a slit width condition by acquiring slit width setting information that prescribes a relation between the deviation index and the slit width, an
generate the correction plot that sets a value of the slit width corresponding to a value of the deviation index at each coordinate position, with reference to the slit width condition.

12. The light-exposure apparatus according to claim 11, wherein,
in the generation of the correction plot, the controller is configured to determine whether a difference between the correction plot and the deviation correction waveform falls within an acceptable range, and
in the setting of the light-exposure scanning speed, the controller is configured to set the light-exposure scanning speed when the difference falls within the acceptable range.

13. The light-exposure apparatus according to claim 12, wherein
the slit width setting information prescribes a relation between the deviation index and the slit width such that a value of the slit width is larger as a value of the deviation index in absolute value is smaller, and in the generation of the correction plot, the controller is configured to:

reset the slit width condition by selecting a value of the slit width largest next to a currently set value of the slit width from the slit width setting information when the difference does not fall within the acceptable range, and generate the correction plot, thereafter.

14. The light-exposure apparatus according to claim 11, wherein, in the slit width setting information, a value of the slit width is set for each of a plurality of ranges obtained by dividing a range of the deviation index.

15. The light-exposure apparatus according to claim 11, wherein the overlay deviation data is data obtained by actually measuring a light-exposure positional deviation or data obtained by a simulation.

16. The light-exposure apparatus according to claim 11, wherein the deviation index is expressed by an overlay deviation amount of the deviation correction waveform at each coordinate position, or an inclination of the deviation correction waveform at each coordinate position.

* * * * *